United States Patent
Chen et al.

(10) Patent No.: US 10,224,315 B2
(45) Date of Patent: Mar. 5, 2019

(54) LIGHT SOURCE DEVICE HAVING LIGHT-EMITTING DIODE CHIPS OF VARYING THICKNESS

(71) Applicant: Genesis Photonics Inc., Tainan (TW)

(72) Inventors: Cheng-Yen Chen, Tainan (TW); Yun-Li Li, Taipei (TW); Po-Jen Su, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/688,844

(22) Filed: Aug. 28, 2017

(65) Prior Publication Data

US 2018/0006000 A1 Jan. 4, 2018

Related U.S. Application Data

(63) Continuation of application No. 14/886,110, filed on Oct. 19, 2015, now Pat. No. 9,748,209, which is a (Continued)

(30) Foreign Application Priority Data

Apr. 10, 2013 (TW) .............................. 102206511 U

(51) Int. Cl.
*H01L 25/07* (2006.01)
*H01L 25/04* (2014.01)
(Continued)

(52) U.S. Cl.
CPC .......... *H01L 25/0753* (2013.01); *H01L 24/14* (2013.01); *H01L 33/62* (2013.01); (Continued)

(58) Field of Classification Search
CPC .............. H01L 25/0753; H01L 25/042; H01L 25/0655; H01L 25/072; H01L 25/115; (Continued)

(56) References Cited

U.S. PATENT DOCUMENTS 7,524,097 B2 * 4/2009 Turnbull ................... B60L 1/14
362/545
7,938,550 B2 * 5/2011 Takenaka ............... G03B 15/03
362/11
(Continued)

*Primary Examiner* — Ida M Soward
(74) *Attorney, Agent, or Firm* — JCIPRNET

(57) ABSTRACT

A light source device including a substrate, a plurality of first light emitting diode (LED) chips, and at least one second LED chip is provided. The substrate has an upper surface. The plurality of first LED chips are disposed on the upper surface and electrically connected to the substrate. Each of the first LED chips includes a first chip substrate, a first semiconductor layer, and a plurality of first electrodes, and the first electrodes are disposed on the upper surface of the substrate. The second LED chip is disposed on the upper surface and electrically connected to the substrate. The second LED chip includes a second chip substrate, a second semiconductor layer, and a plurality of second electrodes. A thickness of the second chip substrate is different from than a thickness of the first chip substrate, and the second electrodes are disposed on the upper surface of the substrate.

5 Claims, 4 Drawing Sheets

Related U.S. Application Data continuation of application No. 14/248,343, filed on Apr. 9, 2014, now Pat. No. 9,165,909.

(51) Int. Cl.
*H01L 25/11* (2006.01)
*H01L 33/62* (2010.01)
*H01L 27/32* (2006.01)
*H01L 25/075* (2006.01)
*H01L 23/00* (2006.01)
*H01L 27/15* (2006.01)
*H01L 25/065* (2006.01)

(52) U.S. Cl.
CPC ............ *H01L 25/04* (2013.01); *H01L 25/042* (2013.01); *H01L 25/0655* (2013.01); *H01L 25/072* (2013.01); *H01L 25/0756* (2013.01); *H01L 25/112* (2013.01); *H01L 25/115* (2013.01); *H01L 25/117* (2013.01); *H01L 27/156* (2013.01); *H01L 27/3209* (2013.01); *H01L 2924/12041* (2013.01)

(58) Field of Classification Search
CPC .............. H01L 24/14; H01L 33/62; H01L 25/04–25/0756; H01L 25/117; H01L 25/112; H01L 27/3209
See application file for complete search history.

(56) References Cited

U.S. PATENT DOCUMENTS

| | | | | |
|---|---|---|---|---|
| 8,106,411 | B2* | 1/2012 | Tsuji | H01L 25/0753 257/88 |
| 8,110,921 | B2* | 2/2012 | Kunimoto | H01L 23/5389 257/724 |
| 8,294,162 | B2* | 10/2012 | Nakajima | H01L 25/0753 257/88 |
| 8,791,473 | B2* | 7/2014 | Yokogawa | H01L 25/0753 257/88 |
| 8,974,922 | B2* | 3/2015 | Hwang | C09K 11/06 428/690 |
| 8,987,023 | B2* | 3/2015 | Tsutsui | H01L 25/0753 257/E33.061 |
| 9,281,451 | B2* | 3/2016 | Yeh | H01L 33/48 |
| 9,754,926 | B2* | 9/2017 | Donofrio | H01L 25/0753 |
| 2006/0067073 | A1* | 3/2006 | Ting | H01L 25/0753 362/231 |
| 2008/0237614 | A1* | 10/2008 | Ishikura | H01L 25/0753 257/89 |
| 2014/0367709 | A1* | 12/2014 | Bierhuizen | H01L 25/0753 257/88 |
| 2015/0049459 | A1* | 2/2015 | Peeters | H01L 25/0753 362/84 |
| 2017/0162758 | A1* | 6/2017 | Weiler | H01L 33/504 |

* cited by examiner

LIGHT SOURCE DEVICE HAVING LIGHT-EMITTING DIODE CHIPS OF VARYING THICKNESS

CROSS-REFERENCE TO RELATED APPLICATION

This application is a continuation application of and claims the priority benefit of U.S. application Ser. No. 14/886,110, filed on Oct. 19, 2015, now allowed. The prior U.S. application Ser. No. 14/886,110 is a continuation application of and claims the priority benefit of U.S. application Ser. No. 14/248,343, filed on Apr. 9, 2014, now patented, issued as U.S. Pat. No. 9,165,909. The prior U.S. application Ser. No. 14/248,343 claims the priority benefit of Taiwan Application Ser. No. 102206511, filed on Apr. 10, 2013. The entirety of each of the above-mentioned patent applications is hereby incorporated by reference herein and made a part of this specification.

BACKGROUND OF THE INVENTION

Field of the Invention

The invention relates to a light source module, and more particularly, to a light source module using a light-emitting diode chip as a light source.

Description of Related Art

Due to advantages such as long service life, small size, high shock resistance, low heat generation, and low power consumption, LEDs have been widely applied in indicators or light sources in household equipment and various other equipments. In recent years, LEDs have been developed to have high-power, and therefore the applications thereof have been expanded to road illumination, large outdoor billboards, traffic lights, and similar areas. In the future, LEDs may even become the main illumination light source with both power-saving and environment-protecting functions.

In general, in an LED light source module, a plurality of LED chips is disposed on a substrate in a matrix arrangement. However, lateral light emitted by the LED chip is absorbed by the other adjacent LED chips. As a result, the lateral light emitted by the LED chips cannot be effectively utilized, thereby reducing the optical efficiency of the LED light source module.

SUMMARY OF THE INVENTION

The invention provides a light source module with good light-emitting efficiency.

The light source module of the invention includes a substrate, a plurality of first LED chips, and at least one second LED chip. The substrate has an upper surface. The plurality of first LED chips are disposed on the upper surface and electrically connected to the substrate. The second LED chip is disposed on the upper surface and electrically connected to the substrate. A first distance is between a top surface of each of the first LED chips away from the upper surface of the substrate and the upper surface, a second distance is between a top surface of the second LED chip away from the upper surface of the substrate and the upper surface, and the second distance is greater than each of the first distances.

In an embodiment of the invention, the substrate includes a plurality of first pads and a plurality of second pads. The first pads are embedded in the upper surface of the substrate, wherein a surface of each of the first pads is slightly aligned with the upper surface of the substrate. Each of the first LED chips is electrically connected to the substrate through the corresponding first pads. The second pads are disposed on the upper surface of the substrate, wherein the second LED chip is electrically connected to the substrate through the corresponding second pads.

In an embodiment of the invention, each of the first LED chips includes a first chip substrate, a first semiconductor layer, and a plurality of first electrodes. The second LED chip includes a second chip substrate, a second semiconductor layer, and a plurality of second electrodes. The thickness of the second chip substrate is greater than the thickness of each of the first chip substrates, and the first electrodes and the second electrodes are all disposed on the upper surface of the substrate.

In an embodiment of the invention, the thickness of the second chip substrate is between a magnitude of 1 and $1+S\cot(\theta/2)/d''$ of the thickness of each of the first chip substrates, wherein S is the spacing of each of the first LED chips and the second LED chip, $d''$ is the thickness of the first chip substrate, and $\theta$ is the beam angle of each of the first LED chips.

In an embodiment of the invention, the second LED chip is located between any two adjacent first LED chips.

In an embodiment of the invention, the first LED chips surround the second LED chip.

In an embodiment of the invention, the first LED chips are a plurality of flip-chip LED chips.

In an embodiment of the invention, the second LED chip is a flip-chip LED chip.

In an embodiment of the invention, the second distance is between a magnitude of 1 and $1+S\cot(\theta/2)/d$ of each of the first distances, wherein S is the spacing of each of the first LED chips and the second LED chip, d is a first distance, and $\theta$ is the beam angle of each of the first LED chips.

In an embodiment of the invention, a side surface of the second LED chip has a high reflectance material.

Based on the above, since in the light source module of the invention, the distance between a top surface of the second LED chip away from the upper surface of the substrate and the upper surface of the substrate is greater than the distance between a top surface of each of the first LED chips away from the upper surface of the substrate and the upper surface of the substrate, the second LED chip can effectively reflect lateral light emitted from the first LED chips such that the light source module has good light-emitting efficiency.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
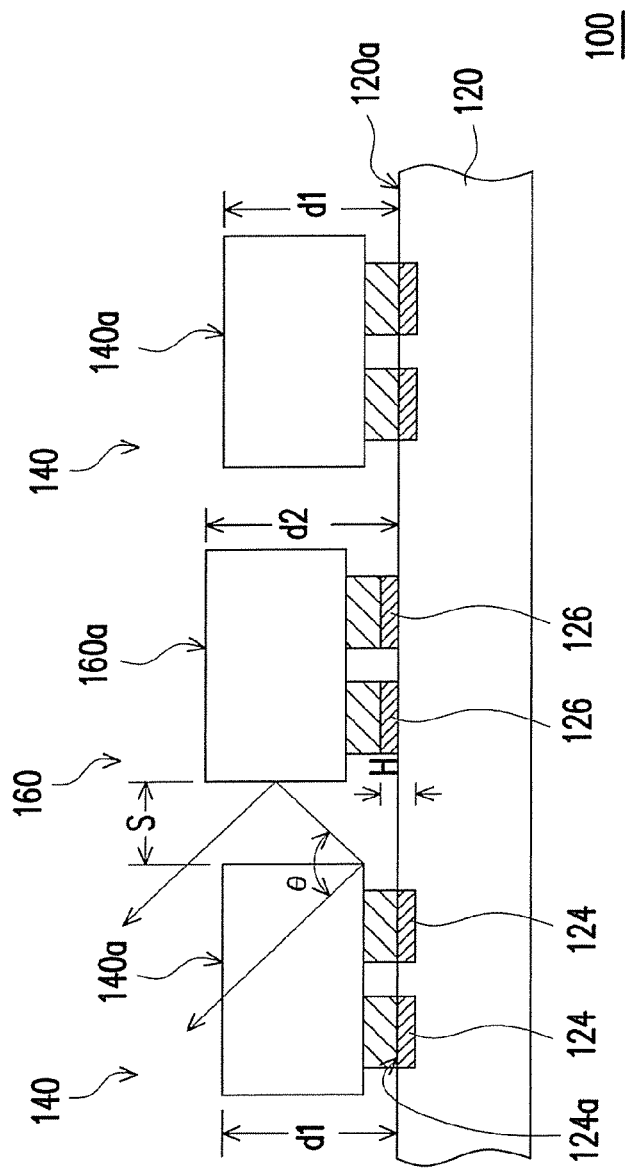
FIG. 1 illustrates a cross-sectional schematic view of a light source module of an embodiment of the invention.

FIG. 1 illustrates a cross-sectional schematic view of a light source module of an embodiment of the invention. Referring to FIG. 1, a light source module 100 includes a substrate 120, a plurality of first light-emitting diode (LED) chips 140, and at least one second LED chip 160 (only one is schematically shown in FIG. 1). The substrate 120 has an upper surface 120a. The plurality of first LED chips 140 are disposed on the upper surface 120a and electrically connected to the substrate 120. The second LED chip 160 is disposed on the upper surface 120a and electrically connected to the substrate 120. A first distance d1 is between a top surface 140a of each of the first LED chips 140 away from the upper surface 120a of the substrate 120 and the upper surface 120a of the substrate 120, a second distance d2 is between a top surface 160a of the second LED chip 160 away from the upper surface 120a of the substrate 120 and the upper surface 120a of the substrate 120, and the second distance d2 is greater than each of the first distances d1. In this way, the second LED chip 160 can effectively reflect lateral light emitted from the first LED chips 140.

Referring further to FIG. 1, specifically, the substrate 120 includes a plurality of first pads 124 and a plurality of second pads 126. The first pads 124 are embedded in the upper surface 120a of the substrate 120, wherein a surface 124a of each of the first pads 124 is slightly aligned with the upper surface 120a of the substrate 120, and each of the first LED chips 140 is electrically connected to the substrate 120 through the corresponding first pads 124. The second pads 126 are disposed on the upper surface 120a of the substrate 120, wherein the second LED chip 160 is electrically connected to the substrate 120 through the second pads 126. In the present embodiment, the first pads 124 can be regarded as embedded pads, and the second pads 126 can be regarded as ordinary pads. That is, a height difference H is between the first pads 124 and the second pads 126. The design of each of the first pads 124 and the second pads 126 allows the second distance d2 between the top surface 160a of the second LED chip 160 and the upper surface 120a of the substrate 120 to be greater than the first distance d1 between the top surface 140a of each of the first LED chips 140 and the upper surface 120a of the substrate 120. Preferably, the second distance d2 is between a magnitude of 1 and $1+S\cot(\theta/2)/d1$ of each of the first distances d1, wherein S is the spacing of each of the first LED chips 140 and the second LED chip 160, d1 is the first distance, and $\theta$ is the beam angle of each of the first LED chips 140.

Moreover, in the present embodiment, the first LED chips 140 and the second LED chip 160 can be the exact same LED chips. That is, the first LED chips 140 and the second LED chip 160 can have, for instance, the same dimension and size and emit light of the same color. Therefore, the second distance d2 of the present embodiment being greater than each of the first distances d1 is the result of the structural configuration of each of the first pads 124 and the second pads 126 of the substrate 120. Of course, the invention does not limit the structural pattern of each of the first LED chips 140 and the second LED chip 160. In other embodiments, the first LED chips 140 and the second LED chip 160 can be LED chips of different dimensions, different sizes, and emit light of different colors. The different LED chips still belong to the technical solution applicable to the invention and do not depart from the scope of the invention to be protected. Moreover, the substrate 120 of the present embodiment can be a transparent substrate such as a sapphire substrate. The first LED chips 140 can be a plurality of flip-chip LED chips. The second LED chip 160 can be a flip-chip LED chip.

Since a height difference H is between the first pads 124 and the second pads 126 of the substrate 120, when the first LED chips 140 and the second LED chip 160 have the same dimension and size, the second distance d2 between the top surface 160a of the second LED chip 160 away from the upper surface 120a of the substrate 120 and the upper surface 120a of the substrate 120 is greater than the first distance d1 between the top surface 140a of each of the first LED chips 140 away from the upper surface 120a of the substrate 120 and the upper surface 120a of the substrate 120. In this way, the second LED chip 160 can effectively reflect lateral light emitted from the first LED chips 140 such that the light source module 100 has good light-emitting efficiency.

It should be mentioned here that, the following embodiments use the reference numerals of the embodiments above and a portion of the contents thereof, wherein the same numerals are used to represent the same or similar elements and descriptions of the same technical contents are omitted. The omitted portions are described in the embodiments above, and are not repeated in the embodiments below.

Figure 2:
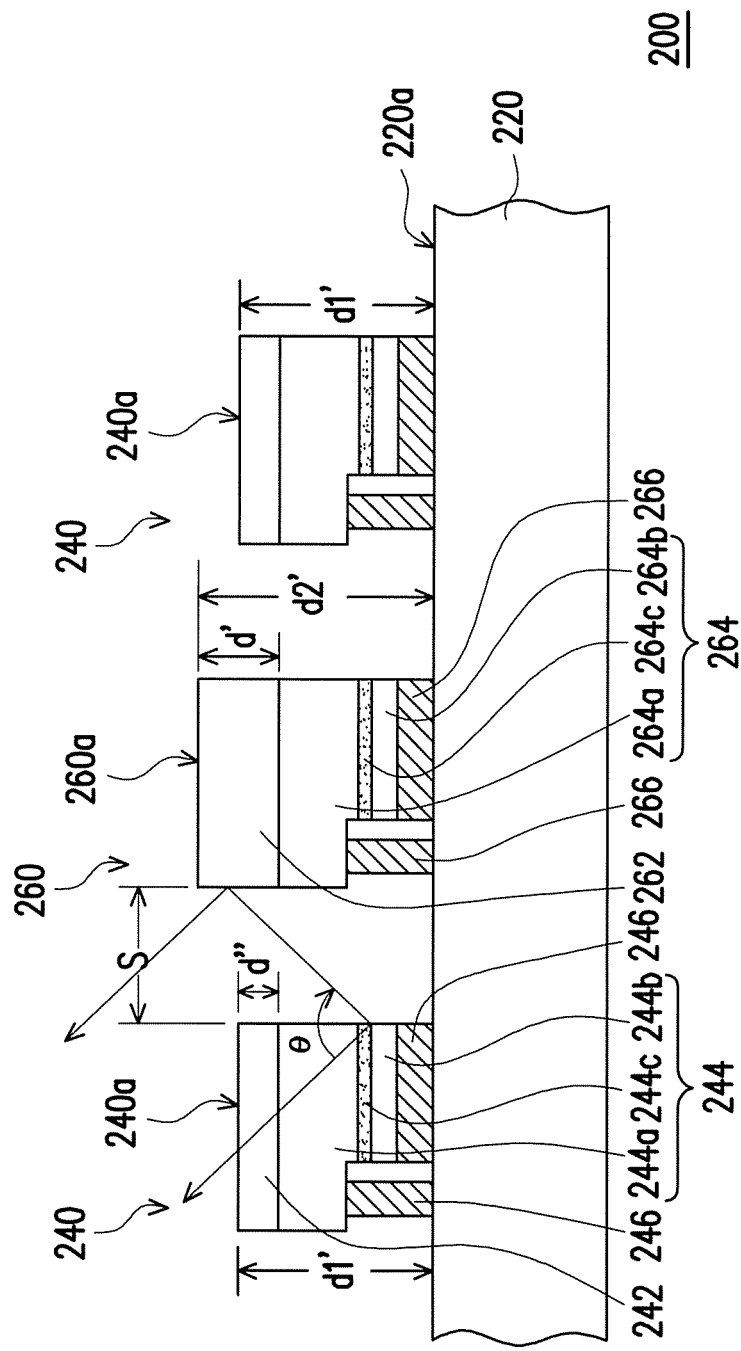
FIG. 2 illustrates a cross-sectional schematic view of a light source module of another embodiment of the invention.

FIG. 2 illustrates a cross-sectional schematic view of a light source module of another embodiment of the invention. Referring to FIG. 2, a light source module 200 of the present embodiment is similar to the light source module 100 of FIG. 1, with the difference being: a plurality of first LED chips 240 and a second LED chip 260 of the present embodiment have different structural patterns.

Specifically, each of the first LED chips 240 of the present embodiment includes a first chip substrate 242, a first semiconductor layer 244, and a plurality of first electrodes 246. The first semiconductor layer 244 is formed by a first-type doped semiconductor layer 244a, a second-type doped semiconductor layer 244b, and a first light-emitting layer 244c, wherein the first light-emitting layer 244c is between the first-type doped semiconductor layer 244a and the second-type doped semiconductor layer 244b. The second LED chip 260 includes a second chip substrate 262, a second semiconductor layer 264, and a plurality of second electrodes 266. The second semiconductor layer 264 is formed by a third-type doped semiconductor layer 264a, a fourth-type doped semiconductor layer 264b, and a second light-emitting layer 264c, wherein the second light-emitting layer 264c is disposed between the third-type doped semiconductor layer 264a and the fourth-type doped semiconductor layer 264b. As shown in FIG. 2, the thickness d' of the second chip substrate 262 is greater than the thickness d" of each of the first chip substrates 242, and the first electrodes 246 and the second electrodes 266 are all disposed on the upper surface 220a of the substrate 220. In other words, in the present embodiment, the thickness d" of the first chip substrate 242 is different from the thickness d' of the second chip substrate 262, and therefore a second distance d2' is greater than a first distance d1'. Preferably, the thickness d' of the second chip substrate 262 is between a magnitude of 1 and $1+S\cot(\theta/2)/d"$ of the thickness d" of each of the first chip substrates 242, wherein S is the spacing of each of the first LED chips 240 and the second LED chip 260, d" is the thickness of the first chip substrate 242, and $\theta$ is the beam angle of each of the first LED chips 240.

Since in the present embodiment, the thickness d" of the first chip substrate 242 of the first LED chips 240 is different from the thickness d' of the second LED chip substrate 262 of the second LED chip 260, the second distance d2' between the top surface 260a of the second LED chip 260 away from the upper surface 220a of the substrate 220 and the upper surface 220a of the substrate 220 is greater than the first distance d1' between the top surface 240a of each of the first LED chips 240 away from the upper surface 220a of the substrate 220 and the upper surface 220a of the substrate 220. In this way, the second LED chip 260 can effectively reflect lateral light emitted from the first LED chips 240 such that the light source module 200 has good light-emitting efficiency.

Figure 3:
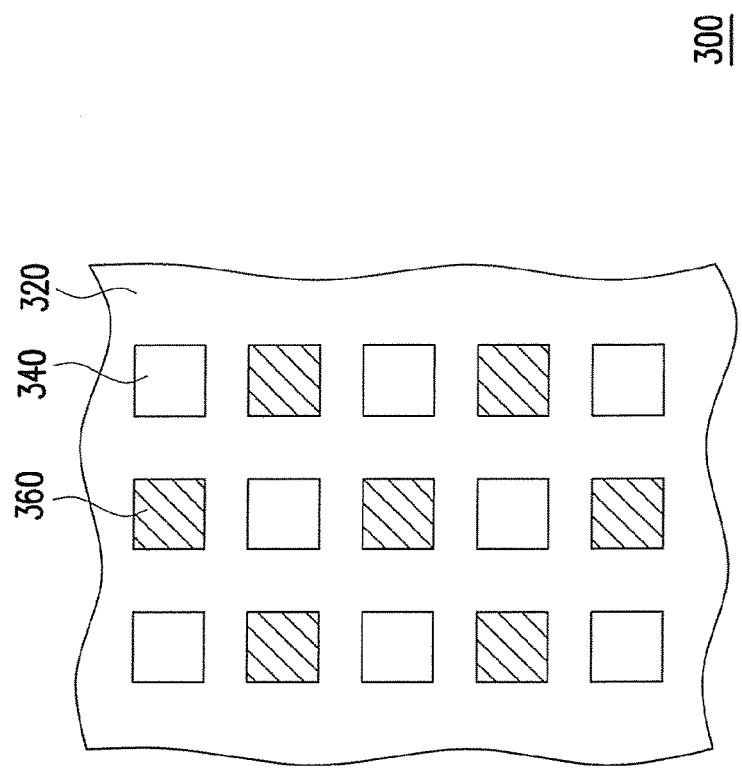
FIG. 3 illustrates a schematic top view of a light source module of yet another embodiment of the invention.

FIG. 3 illustrates a schematic top view of a light source module of yet another embodiment of the invention. Referring to FIG. 3, a plurality of first LED chips 340 and a plurality of second LED chips 360 of a light source module 300 are arranged in a matrix on a substrate 320. To make the second LED chip 360 reflect lateral light emitted from the first LED chips 340 effectively, each of the second LED chips 360 is located between any two adjacent first LED chips 340. As shown in FIG. 3, the periphery of each of the first LED chips 340 has at least four second LED chips 360. As a result, lateral light of the first LED chips 340 can be effectively reflected such that the light source module 300 has better light-emitting efficiency.

Figure 4:
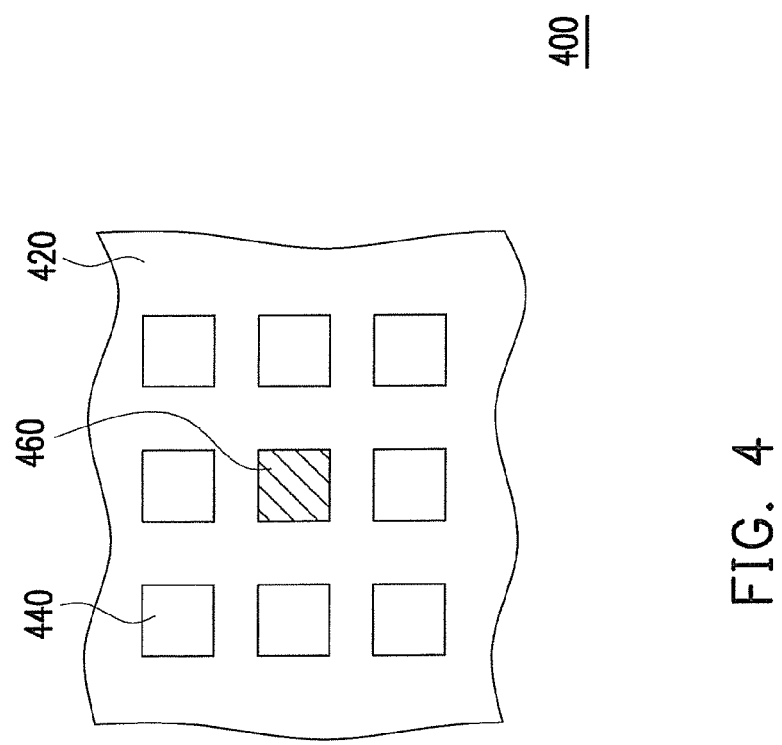
FIG. 4 illustrates a schematic top view of a light source module of still yet another embodiment of the invention.

FIG. 4 illustrates a schematic top view of a light source module of still yet another embodiment of the invention. Referring to FIG. 4, in the present embodiment, a plurality of first LED chips 440 of a light source module 400 surround a second LED chip 460. In this way, the second LED chip 460 located in the center can effectively reflect lateral light emitted from the first LED chips 440 in the periphery. Alternatively, in other embodiments not shown, the plurality of first LED chips of the light source module can be arranged to form a plurality of ring structures, the plurality of second LED chips can be arranged to form a plurality of ring structures, and the ring structures can be coaxially arranged. In particular, the ring structures formed by the first LED chips and the ring structures formed by the second LED chips are alternately arranged. Such configuration still belongs to the technical solution applicable to the invention and does not depart from the scope of the invention to be protected. In this way, the second LED chip 460 can also effectively reflect lateral light emitted from the first LED chips 440 such that the light source module 400 has better light-emitting efficiency.

Based on the above, in the light source module of the invention, the distance between the top surface of the second LED chip away from the upper surface of the substrate and the upper surface of the substrate is greater than the distance between a top surface of each of the first LED chips away from the upper surface of the substrate and the upper surface of the substrate so as to achieve the effect of the second LED chip reflecting lateral light emitted from the first LED chips effectively. As a result, the light source module has good light-emitting efficiency.

Moreover, if the effect of the second LED chip reflecting lateral light emitted from the first LED chips is to be increased, then a side surface of the second LED chip has a high reflectance substance (not shown). In this way, not only the absorption of lateral light of the first LED chips can be reduced such that lateral light of the first LED chips is effectively emitted outward after being reflected, lateral light of the second LED itself can also be reflected such that lateral light of the second LED is emitted upward in a more concentrated manner.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A light source device, comprising:
   a substrate having an upper surface;
   at least one first light-emitting diode (LED) chip disposed on the upper surface and electrically connected to the substrate; and
   at least one second LED chip disposed on the upper surface and electrically connected to the substrate, wherein a first distance from the upper surface to a top surface of the at least one first LED chip is higher than a second distance from the upper surface to a top surface of the at least one second LED chip, and a thickness of the at least one second LED chip is different from a thickness of the at least one first LED chip,
   wherein the at least one first LED chip comprises a first chip substrate, the at least one second LED chip comprises a second chip substrate, and a thickness of the second chip substrate is different from a thickness of the first chip substrate.

2. The light source device as recited in claim 1, wherein the at least one first LED chip or the at least one second LED chip is flipped on the substrate.

3. The light source device as recited in claim 1, wherein the at least one first LED chip and the at least one second LED chip emit light of a same color.

4. The light source device as recited in claim 1, wherein the at least one first LED chip and the at least one second LED chip have a same dimension in horizon.

5. The light source device as recited in claim 1, wherein when a quantity of the at least one first LED chip or a quantity of the at least one second LED chip is plural, the at least one first LED chip(s) and the at least one second LED chip(s) are arranged alternately.

* * * * *